United States Patent [19]
Fujita et al.

[11] Patent Number: 5,169,829
[45] Date of Patent: Dec. 8, 1992

[54] METHOD FOR PRODUCING A SUPERCONDUCTING CIRCUIT

[75] Inventors: Nobuhiko Fujita; Hideo Itozaki; Saburo Tanaka; Naoji Fujimori; Takahiro Imai; Keizo Harada; Shuji Yazu; Tetsuji Jodai, all of Hyogo; Noriyuki Yoshida, Osaka; Satoshi Takano, Osaka; Kenji Miyazaki, Osaka; Noriki Hayashi, Osaka, all of Japan

[73] Assignee: Sumitomo Electric Industries, Ltd., Osaka, Japan

[21] Appl. No.: 873,351

[22] Filed: Apr. 21, 1992

Related U.S. Application Data

[63] Continuation of Ser. No. 655,197, Feb. 14, 1991, which is a continuation of Ser. No. 409,053, Sep. 19, 1989, which is a continuation of Ser. No. 195,147, May 18, 1988.

[30] Foreign Application Priority Data

May 18, 1987 [JP] Japan .................. 62-120817
May 20, 1987 [JP] Japan .................. 62-123449
Aug. 24, 1987 [JP] Japan .................. 62-209930
Aug. 24, 1987 [JP] Japan .................. 62-209931

[51] Int. Cl.$^5$ .................................. H01B 12/00
[52] U.S. Cl. .................................. 505/1; 204/192.24; 505/730; 505/742
[58] Field of Search .................. 204/192.15, 192.24, 204/192.31; 250/492.1, 492.2, 492.3; 427/35, 38; 505/1, 730, 731, 742, 815, 816, 819

[56] References Cited

U.S. PATENT DOCUMENTS 3,932,315  1/1976  Sleight ........................... 252/521
4,316,785  2/1982  Suzuki et al. ................. 505/1 XR
4,351,712  9/1982  Cuomo et al. ........ 204/192.31 XR

FOREIGN PATENT DOCUMENTS 0285132  10/1988  European Pat. Off. .
2602246  2/1988  France .
60-173885  9/1985  Japan .

OTHER PUBLICATIONS

Ishizawa, Y., et al., "Superconducting Properties of Highly Oxidized Superconductor $Ba_{2-x}Y_{1+x}Cu_3O_{7-y}$" Japanese Journal of Applied Physics, vol. 26, No. 5, May 1987.

Ruggiero, S. T., et al., "Ion-Beam-Deposited Films for Refractory-Metal Tunnel Junctions", *IEEE Transactions on Magnetics*, vol. MAG-19, No. 3, Part 2, May 1983.

Martin, P. J., et al., "Review Ion-based Methods for Optical Thin Film Deposition", *Journal of Meterials Science*, vol. 21, 1986.

Aizaki et al., "$YBa_2Cu_zO_y$... Annealing", Jap. Jour. of Appl. Phys., vol. 27, No. 2, Feb. 1988, pp. 231–233.

A. Ourmazd et al., "Microstructure ... $Yba_2Cu_3O_{6.9}$", Extended Abstract, High Temp. Superconductors, Proceedings of Symposium S, Apr. 1987.

Koch et al., "Thin Films ... $Yba_2Cu_3O_y$". Proceedings of Symposium S, Apr. 1987, Spring Meeting of Mat. Res. Society.

Clark et al., "Effects ... Superconductor", Appl. Phys. Lett. 51(2), Jul. 13, 1987, pp. 139–141.

Tarason et al., "HighTemp. ... Cu–O Planes", Aug. 1987, American Chem Soc., pp. 198–209.

Magata et al., "High $T_c$ ... Sputtering", Jap. Journal of Applied Physics, vol. 26, No. 4, Apr. 1987, pp. L410–L414.

J. G. Vednorz et al.–"Possible High $T_c$ Superconductivity in the Ba–La–Cu–O System", Z. PhysB–Condensed Matter 64, pp. ]89–]93 (1986).

*Primary Examiner*—Nam X Nguyen
*Attorney, Agent, or Firm*—Kerkam, Stowell, Kondracki & Clarke

[57] ABSTRACT

An improvement in a process for manufacturing a superconductor, characterized by irradiating a material composed of compound oxide by one of ion beams selected from oxygen ion beam, inert gas ion beams and an ion beam consisting of a mixture of oxygen gas and inert gas to convert said material into a superconductor. When a focused ion beam is directed onto desired areas on said film layer, the areas irradiated by the ion beam are converted to a superconductor in a form of a superconducting circuit.

6 Claims, 4 Drawing Sheets

METHOD FOR PRODUCING A SUPERCONDUCTING CIRCUIT

This is a continuation of application Ser. No. 07/655,197, filed Feb. 14, 1991; which is a continuation of application Ser. No. 07/409,053, filed Sep. 19, 1989; which is a continuation of application Ser. No. 195,147, filed May 18, 1988.

BACKGROUND OF THE INVENTION

1. Field of the invention

The present invention relates to a process for manufacturing a superconductor having a high critical temperature and a method for producing a superconducting circuit. More particularly, it relates to a method for producing a circuit pattern of a superconductor having a high critical temperature which is used in the field of electronics.

2. Description of the related art

The superconductivity is a phenomenon which is understood as a phenomenon of phase change of electrons under which the electrical resistance become zero and the perfect diamagnetism is observed. Thus, under the superconducting condition, electric current of a very high current density can be delivered without any loss of power. Therefore, the power loss in circuits used in the field of electronics can be reduced greatly. It is also expected to utilize the superconductor in the field of a high sensitive sensors or detectors for sensing very weak magnetic field, microwave, radiant ray or the like.

However, the critical temperature could not exceed 23.2K of $Nb_3Ge$ which was the highest Tc heretofore for all studies for the past ten years.

Possibility of existence of a new type of superconducting materials having much higher Tc was revealed by Bednorz and Müller who discovered a new oxide type superconductor in 1986 [Z. Phys. B64 (1986) 189].

It had been known that certain ceramics material of compound oxides exhibit the property of superconductivity. For example, U.S. Pat. No. 3,932,315 discloses Ba-Pb-Bi type compound oxide which shows superconductivity and Japanese patent laid-open No. 60-173,885 discloses that Ba-Bi type compound oxides also show superconductivity. These type superconductors, however, possess a rather lower transition temperature of about 10K and hence usage of liquidized helium (boiling point of 4.2K) as cryogen is indispensable to realize superconductivity.

This new oxide type superconducting material discovered by Bednorz and Müller is $[La, Ba]_2CuO_4$ which is called as the $K_2NiF_4$-type oxide having a crystal structure which is similar to known perovskite type oxides. The $K_2NiF_4$-type oxides show such higher Tc as 30K which are extremely higher than the known superconducting materials.

It was also reported in the newspaper that C. W. Chu et al discovered in the United States of America another type of superconducting material having the critical temperature of in the order of 90K in February 1987, and hence possibility of existence of high-temperature superconductors have burst on the scene.

However, the above mentioned new type superconducting materials which was just born and which are presumed to be classified in the perovskite crystals of La-Ba-Cu-O system and Y-Ba-Cu-O system have been studied and developed mainly in a form of sintered articles. In already known methods, the superconducting materials are compacted in a metal pipe and then are drawn to produce a superconducting wire or they are blended with organic binder to prepare a paste for circuit printing. These method, however, include inevitably the final sintering stage of the superconducting material shaped into a wire-form or a layered form, so that higher dimensional stability of the sintered product can not be expected due to shrinkage which occur during the sintering operation and it is difficult to produce a variety of articles having desired configuration freely and precisely. In other words, a finely patterned circuit for electronics devices can not be produced by the conventional methods. Still more, the products do not possess satisfactory properties of superconductivity because the oxygen contents which is one of the critical factors of this type of superconductor can not be controlled or adjusted to an optimum value for realizing higher critical temperature.

It may be also used a variety of vapour phase deposition techniques to produce a thin film of superconductor which is applicable to electric circuits having fine patterns. In fact, in these techniques, it is possible to deposit the superconducting material on a substrate to produce a fine circuit pattern by means of a masking sheet. Such superconducting circuit pattern may be produced also by the ion-etching or ion-sputtering technique in which predetermined portions of the thin film of superconductor deposited on the substrate is cut or removed to leave a circuit pattern.

However, in the conventional sputtering technique for preparing a thin film of superconductor, sputtering must be carried out in the presence of oxygen gas added in a sputtering gas and also the substrate must be heated at such a temperature that an improved crystalline structure is obtained. Still more, the resulting sputtered film must be heat-treated in an atmosphere containing oxygen gas to increase the oxygen contents in the thin film. For example, in Japanese patent laid-open No. 56-109824 which discloses a method for preparing a thin film of superconductor represented by $BaPb_{1-x}Bi_xO_3$ (in which $0.05 \leq x \leq 0.35$), high-frequency sputtering is carried out in an oxygen containing atmosphere and then the resulting film must be further heated at 500° to 550° C. We also described sputtering conditions for preparing superconducting thin films by the sputtering technique in co-pending U.S. patent Ser. No. 152,714 filed on May 2, 1988.

The abovementioned conventional sputtering technique itself is satisfactory but is difficult to control the nature of gas in the atmosphere, resulting in that the crystal structure in a thin film obtained can not be controlled precisely.

Still more, it is not only difficult to perform the patterning operation of superconducting circuits easily and precisely on the thin film produced by the abovementioned sputtering technique but impossible to provide a superconducting circuit of high quality.

Therefore, the abovementioned conventional techniques are not suitable for production of patterned superconducting circuit on a substrate.

An object of the present invention is to overcome the abovementioned problems of the conventional technique and to provide a process for controlling the crystal structure more precisely, particularly for adjusting the oxygen contents in a superconductor.

Another object of the present invention is to provide a simple method for producing a fine superconducting circuit pattern having improved superconducting property on a substrate.

SUMMARY OF THE INVENTION

According to the present invention, a material composed of compound oxide is irradiated by an ion beam to convert the material to a superconductor. The material may be uniformly irradiated by non-focused irradiation of the ion beam to convert it totally into a superconductor or may be irradiated by a focused irradiation of the ion beam to produce a patterned superconducting circuit.

A process for manufacturing a superconductor which is provide by the first aspect of the present invention is characterized in that a material composed of compound oxide is irradiated by one of ion beams selected from oxygen ion beam, inert gas ion beam and an ion beam consisting of a mixture of oxygen gas and inert gas to convert said material into a superconductor.

According to the second aspect of the present invention, it is provided a method for producing a superconducting circuit pattern characterized by the steps comprising depositing a film layer of compound oxide on a substrate, and then by directing a focused ion beam selected from oxygen ion beam, inert gas ion beam and an ion beam consisting of a mixture of oxygen gas and inert gas onto desired areas on said film layer so that the areas irradiated by the ion beam are converted to a superconductor.

The term of "a material composed of compound oxide" means an compound oxide which does not exhibit satisfactory superconducting property but can be changed to a superconductor after the irradiation of ion beam.

The material composed of compound oxide may have a form of a bulky mass such as a block or rod, a form of a self-supporting sheet such as a plate or a film, or a form of a thin film deposited on a substrate.

The material having in a form of the bulky mass can be prepared usually by powder sintering technique. The sintering is performed generally without any binder but can be effected with adding a binder if necessary.

When the material composed of compound oxide takes a form of a film layer, it may be prepared on a substrate by physical vapour deposition technique such as sputtering, ion-plating, molecular beam epitaxial growth or the like or by chemical deposition technique such as CVD.

The ion beam usable in the present invention is selected from oxygen ion beam, inert gas ion beam and an ion beam consisting of a mixture of oxygen gas and inert gas.

When the oxygen ion beam is used, adequate oxygen can be introduced into or supplied to the material of compound oxide so that an oxygen deficient crystal structure which is preferable for the compound oxide type superconductor may be realized. In fact, irradiation of the oxygen ion beam create a density gradient of oxygen in the direction of depth so that the optimum oxygen contents can be realized in the material. In other words, since a range of the optimum values of oxygen contents is rather narrow, the conventional sintering technique can not produce or is difficult to produce a superior superconductor having the optimum value of oxygen contents but result in lower Tc and unstable superconducting condition. The oxygen ion beam is preferably composed of ionized O or $O_2$ produced from $O_2$ or $CO_2$ gas.

According to the present invention, inert gases such as argon gas can be also used though the reason why the superconducting property can be improved by the inert gases. In this case, re-ordering of crystal structure may occur in the material of compound oxide by activation energy given by irradiation of these gases so that a preferable crystal structure is realized.

The ion beam can be emitted from one of ion sources selected from a radio-frequency ion source, a microwave ion source and a PIG type ion source.

If the focused ion beam is directed to predetermined areas on the film layer of compound oxide, only irradiated areas can be converted locally into a superconductor which exhibit superior superconducting property at a predetermined temperature owing to improvement in the crystal structure in the film, so that a circuit pattern of superconductor can be produced. In practice, the circuit pattern may be drawn by scanning the focussed ion beam or by irradiating the film layer through a patterned mask film or photoresist by the ion beam so that a predetermined area of the film layer is converted into a superconductor.

According to one embodiment, one of ion beams selected from oxygen ion beam, inert gas ion beam and an ion beam consisting of a mixture of oxygen gas and inert gas is focused on a material composed of compound oxide whose oxygen contents is insufficient for realizing superconductivity. For example, a film layer of an oxide which is ordinary electro-conductor or insulator is irradiated locally by an ion beam so that only irradiated area is changed to a superconductor while non-irradiated area is left unchanged in the condition of ordinary electro-conductor or insulator in order to produce a superconducting circuit pattern.

According to one preferred embodiment, heat-treatment is effected in an atmosphere containing oxygen after the ion-irradiation or oxygen doping. In practice, after the material is irradiated by oxygen ion, the irradiated oxide is further heated at a temperature of more than 500° C. for more than 3 hours and then cooled slowly at a cooling speed of less than 10° C./min, preferably less than 1° C./min. The heat-treatment is preferably carried out in oxygen containing atmosphere at the partial pressure of oxygen which is higher than 0.1 atm, preferably higher than 1 atm. The heat-treatment can increase homogeneousness of the oxide and ensure optimum of oxygen deficiency due to diffusion of doped oxygen, resulting in that $\Delta T$ (the discrepancy between the onset temperature and the critical temperature) can be reduced.

The abovementioned heat-treatment for the material or the film may be performed during the material or the film is irradiated by the oxygen ion beam or even before the irradiation. This heat-treatment permit to increase the oxygen contents in the material or film layer and to improve the crystal structure thereof.

The material composed of compound oxide which can be applicable to the present invention includes oxide type ceramics such as Y-Ba-Cu-O system, Y-Sr-Cu-O system, La-Ba-Cu-O system and La-Sr-Cu-O system. More generally, they belong to compound oxides including an element $\alpha$ selected from IIa group of the Periodic Table, an element $\beta$ selected from IIIa group of the Periodic Table and copper (Cu). These constituent elements can be substitued partially by at least one of elements selected from a group comprising Al, Fe, Co, Ni, Zn, Ag and Ti.

Selection of an atomic ratio of $\alpha$ to $\beta$ depend on combination of elements. For example, in cases of Ba-Y system, Ba-La system and Sr-La system, the following ratios are preferable:

| | |
|---|---|
| Y/(Ba + Y) system: | 0.06 to 0.94, preferably 0.1 to 0.4 |
| Ba/(Ba + La) system: | 0.04 to 0.96, preferably 0.08 to 0.45 |
| Sr/(La + Sr) system: | 0.03–0.95, preferably 0.05–0.1 |

When the atom ratios are not within the abovementioned range, high Tc can not be observed because the optimum conditions of crystal structure and oxygen deficiency can not be obtained.

The element $\alpha$ selected from IIa group of the Periodic Table is preferably Ba or Sr. The element $\beta$ selected from IIIa group of the Periodic Table is preferably Y, La, Gd, Dy, Ho, Er, Tm, Yb, Nd, Sm or Eu or combinations of these elements.

The superconductor produced according to the present invention from the abovementioned material is a compound oxide represented by the formula:

$$(\alpha_{1-x}\beta_x)Cu_yO_z$$

in which $\alpha$ and $\beta$ means the same definition as above, x is an atomic ratio of $\beta$ with respect to $(\alpha+\beta)$ having a range of $0.1 \leq x \leq 0.9$, and y and z are respective atomic ratios with respect to $(\alpha_{1-x}\beta_x)$ which is considered to be equal to 1 and each satisfy ranges of $0.4 \leq y \leq 3.0$ and $1 \leq z \leq 5$ respectively, and include the following special systems:

$Y_1Ba_2Cu_3O_{7-x}$, $Ho_1Ba_2Cu_3O_{7-x}$, $Lu_1Ba_2Cu_3O_{7-x}$, $Sm_1Ba_2Cu_3O_{7-x}$, $Nd_1Ba_2Cu_3O_{7-x}$, $Gd_1Ba_2Cu_3O_{7-x}$, $Eu_1Ba_2Cu_3O_{7-x}$, $Er_1Ba_2Cu_3O_{7-x}$, $Dy_1Ba_2Cu_3O_{7-x}$, $Tm_1Ba_2Cu_3O_{7-x}$, $Yb_1Ba_2Cu_3O_{7-x}$, $La_1Ba_2Cu_3O_{7-x}$, $(La, Sr)_2CuO_{4-x}$ in which x is a number which satisfies a range of $0 < x < 1$.

The abovementioned oxides possess preferably perovskite type or quasi-perovskite type crystal structure. The term of quasi-perovskite type means a structure which can be considered to have such a crystal structure that is similar to Perovskite-type oxides and includes an orthorhombically distorted perovskite or a distorted oxygen-deficient perovskite or the like.

The material composed of compound oxide taking a form of a bulky mass can be prepared by sintering directly or through a preliminarily sintering stage a powder mixture of oxide and/or carbonate of constituent elements of said material. If necessary, binder may be added to the powder mixture to produce a paste which is sintered later.

Selection of the sintering temperature and the preliminary sintering temperature depend on combinations of elements. In case of the abovementioned special combinations, they can be selected from the following rang:

| system | Preliminary sintering temp. | Final sintering temp. |
|---|---|---|
| Ba—Y | from 250 to 1,200° C. | from 700 to 1,500° C. |
| Ba—La | from 220 to 1,230° C. | from 650 to 1,580° C. |
| Sr—La | from 234 to 1,260° C. | from 680 to 1,530° C. |

The present invention may be further applicable to the other types of compound oxides including the following system:

$$\Theta_4(\Phi_{1-q}Ca_q)_m Cu_n O_{p-r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p=(12+2m+2n)/2$, q is a number which satisfies a range of $0 < q < 1$, and r is a number which satisfies a range of $-2 \leq r \leq +2$. This system is considered to be a single phase of the following compound oxide or a mixed phase consisting mainly thereof:

$Bi_4Sr_4Ca_4Cu_6O_{20+r}$, $Bi_2Sr_2Ca_2Cu_3O_{10-r}$, $Tl_4Ba_4Ca_4Cu_6O_{20-r}$, in which r is a number which satisfies a range of $-2 \leq r \leq +2$.

Now, the present invention will be described with reference to attached drawings which illustrate an apparatus used for carrying out the present invention and a procedure for producing a superconducting circuit pattern according to the present invention but are not limitative of the present invention.

BRIEF DESCRIPTION OF THE DRAWING

Referring to FIG. 1 which illustrates a RF type ion irradiation apparatus including a chamber 1 and an ion source arranged on the chamber 1 and comprising a high-frequency coil 3, a high-frequency power source 4, an ion drawing-in electrode 9 and an electrostatic lens 8. The chamber 1 is provided with a vacuum port 7 connected to a vacuum source (not shown) and a gas inlet port 6 for introducing a gas such as $O_2$ to be ionized into the ion source.

In operation, after a material of compound oxide 2 is placed in the chamber 1, vacuum is created in the chamber 1 and in the ion source and then a gas such as $O_2$ to be ionized is introduced into the ion source. High-frequency power is applied to the high-frequency coil of the ion source and an acceleration voltage is imposed on the ion drawing-in electrode 9 so that ionized gas or an ion beam is drawn from the ion source and is directed onto the compound oxide 2.

When the ion beam is not converged into a form of a narrow ion beam, the whole surface of the compound oxide 2 can be irradiated uniformly so that the compound oxide in total is uniformly changed into a superconductor.

When the ion beam is converged into a narrow ion beam which is scanned along a predetermined pattern on the film layer of compound oxide, a patterned circuit of superconductor can be produced.

Figure 3:
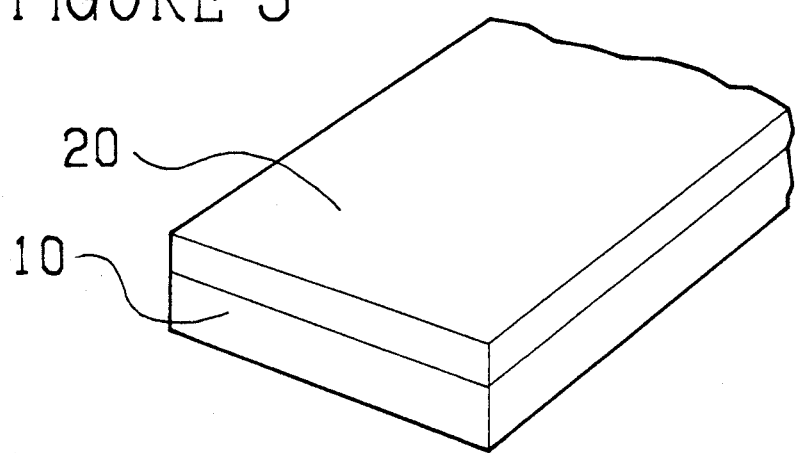
FIGS. 3, 4 and 5 are partial perspective views which illustrate a series of steps for producing a superconducting circuit pattern on a compound oxide deposited on a substrate according to the present invention.
Figure 4:
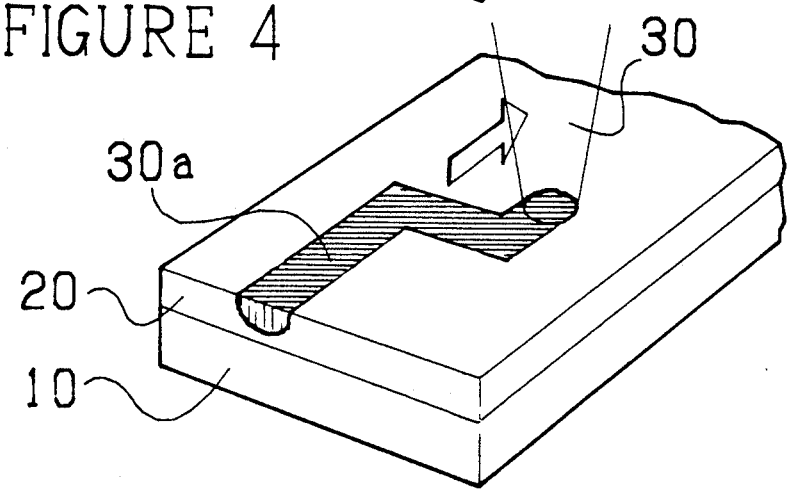
Figure 5:
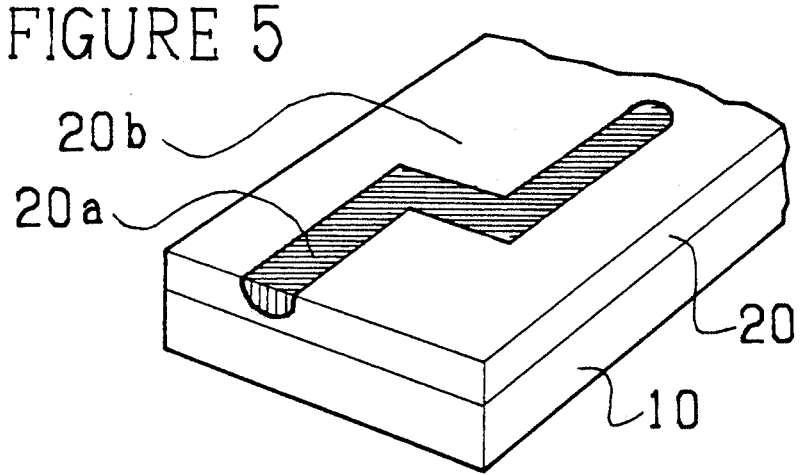
Figure 6:
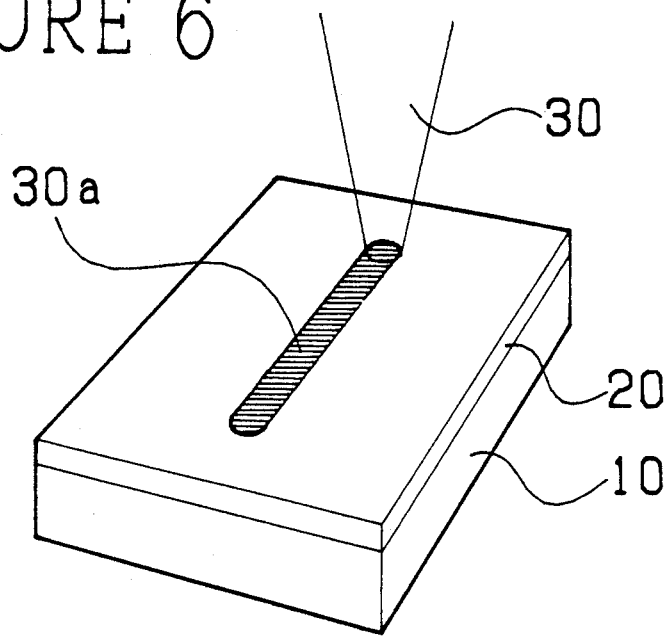
FIGS. 6 and 7 are illustrative views of a superconducting circuit pattern for determining the performance superconducting property which is produced according to another embodiment of the present invention.

Now, we will describe a series of steps for producing a superconducting circuit pattern on a compound oxide deposited on a substrate in reference with FIGS. 3, 4 and 5.

In practice, a thin film 20 of compound oxide is deposited on a substrate 10 by means of the conventional sputtering technique (FIG. 3). The thin film 20 as deposited condition exhibits a nature of insulator or ordinal conductor which has higher electric resistance because the oxygen contents in the film is not enough to realize the superconductivity or because the resulting film does not possess a desirable perovskit crystal structure.

Therefore, a converged or focused ion beam of oxygen 30 is directed to a predetermined area 30a which will be used as wiring lines or conducive lines on the thin film 20 under an acceleration voltage at an order of 10 to 50 KeV and is moved in a direction shown by an arrow in FIG. 4 along a predetermined pattern, so that the doped area 30a irradiated by the oxygen ion beam 30 is subjected to locally non-equibrated heat-treatment which increase the oxygen contents in the film and hence which improve the crystal structure of the film locally.

FIG. 5 shows a circuit pattern formed on the substrate 10 by the abovementioned process. The circuit pattern comprises a fine superconducting wiring line zone 20a which has a width corresponding to an diameter of the ion beam or the doped area 30a and which exhibits superconducting property under a predetermined temperature, and a high resistance zone 20b which does not corresponds to the irradiated area 30a and which is composed of ordinal conductor having higher electric resistance under the predetermined temperature.

In conclusion, the resulting superconductor obtained by the abovementioned process possesses such stable and higher Tc and Tcf that make it possible to use liquidized nitrogen as cryogen. This advantageous merit is obtained by the special condition that permit to produce a superconducting compound oxide having the perovskite type or quasi-perovskite type crystal structure which is thought to be a critical factor to realize superconductivity.

Still more, the superconducting circuit pattern can be produced by the locally limited ion beam irradiation for realizing the abovementioned special condition of thermal treatment locally at a predetermined area. The resulting superconducting circuit pattern can be used at higher Tc and Tcf and hence is applicable to a variety of devices used in the field of electronics, since the fine and precise superconducting circuit pattern can be produced easily.

Now, the process according to the present invention will be described with reference to illustrative Examples, but the scope of the present invention should not be limited thereto.

EXAMPLE 1

Figure 1:
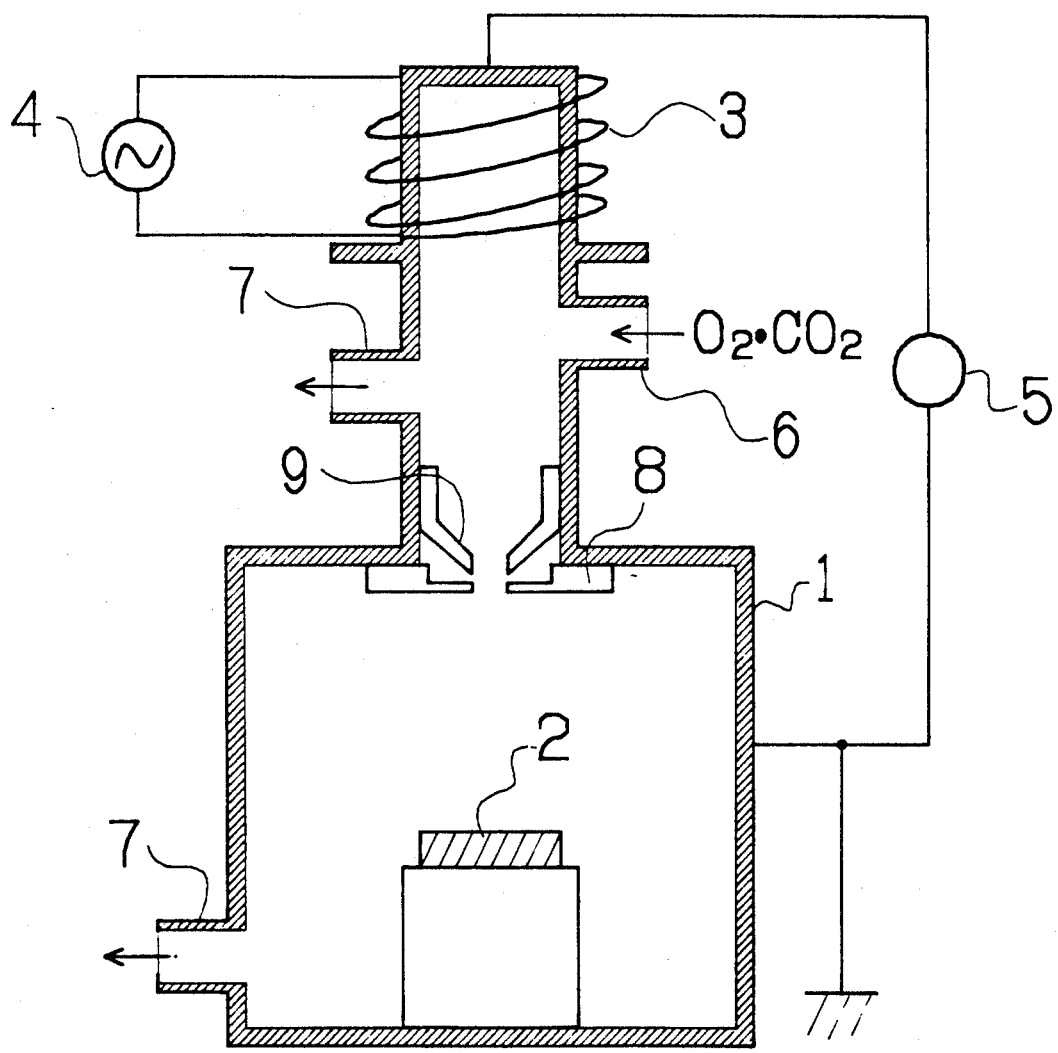
FIG. 1 is an illustrative view of a RF (radio-frequency) type ion irradiation apparatus which can be used in the present invention.

A superconductor was produced by using a RF type ion irradiation apparatus shown in FIG. 1.

At first, powders of $Y_2O_3$ and $BaCO_3$ were mixed at an atom ratio of Y:Ba=1:2 and then a powder of CuO was added to the resulting powder mixture at an atom ratio of Y:Ba:Cu=1:2:3. Then, the resulting powder mixture was sintered at 940° C. to obtain a sintered block of $YBa_2Cu_3O_7$ having a dimension of 20×30×3 mm.

After the block 2 was placed in the chamber 1, the pressure in the chamber 1 was reduced to $10^{-7}$ Torr, oxygen gas of $1.0\times10^{-3}$ Torr was introduced into the ion source. Then, the high-frequency coil was energized by high-frequency at a power of 50 W and an acceleration voltage of 200 kV was applied to the ion drawing-in electrode.

Tc and Tcf measured on the resulting treated block are shown in Table 1.

EXAMPLE 2

The same procedure as Example 1 was repeated except that powders of $Bi_2O_3$, CaO, $SrCO_3$ and CuO were mixed at an atom ratio of Bi:Ca:Sr:Cu=2:2:2:3 and then sintered at 880° C. to obtain a sintered block of $Bi_4Sr_4Ca_4Cu_6O_{20}$.

The result of Tc and Tcf measured is shown in Table 1.

EXAMPLE 3

The block of compound oxide type superconductor obtained in Example 1 was further heated at 850° C. for 8 hours in an atmosphere of oxygen of 1 atm and then cooled slowly at a cooling velocity of 7° C./min.

The result of Tc and Tcf measured is shown in Table 1.

TABLE 1

| | Ion source | | | | |
|---|---|---|---|---|---|
| Example No. | Pressure of $O_2$ (Torr) | RF Power (w) | acceleration voltage (kV) | Tc (K) | Tcf (K) |
| 1 | $1\times10^{-3}$ | 50 | 200 | 102 | 89 |
| 2 | $1\times10^{-4}$ | 60 | 200 | 105 | 90 |
| 3 | $1\times10^{-3}$ | 50 | 200 | 104 | 96 |

These results show that the present invention can provide superconducting oxides possessing improved superconducting property owing to the properly controlled crystal structure and oxygen contents.

EXAMPLES 4 to 6

Superconducting thin films were prepared by using each of the sintered blocks obtained in Examples 1, 2 and 3 as a target in the conventional sputtering machine.

Figure 2:
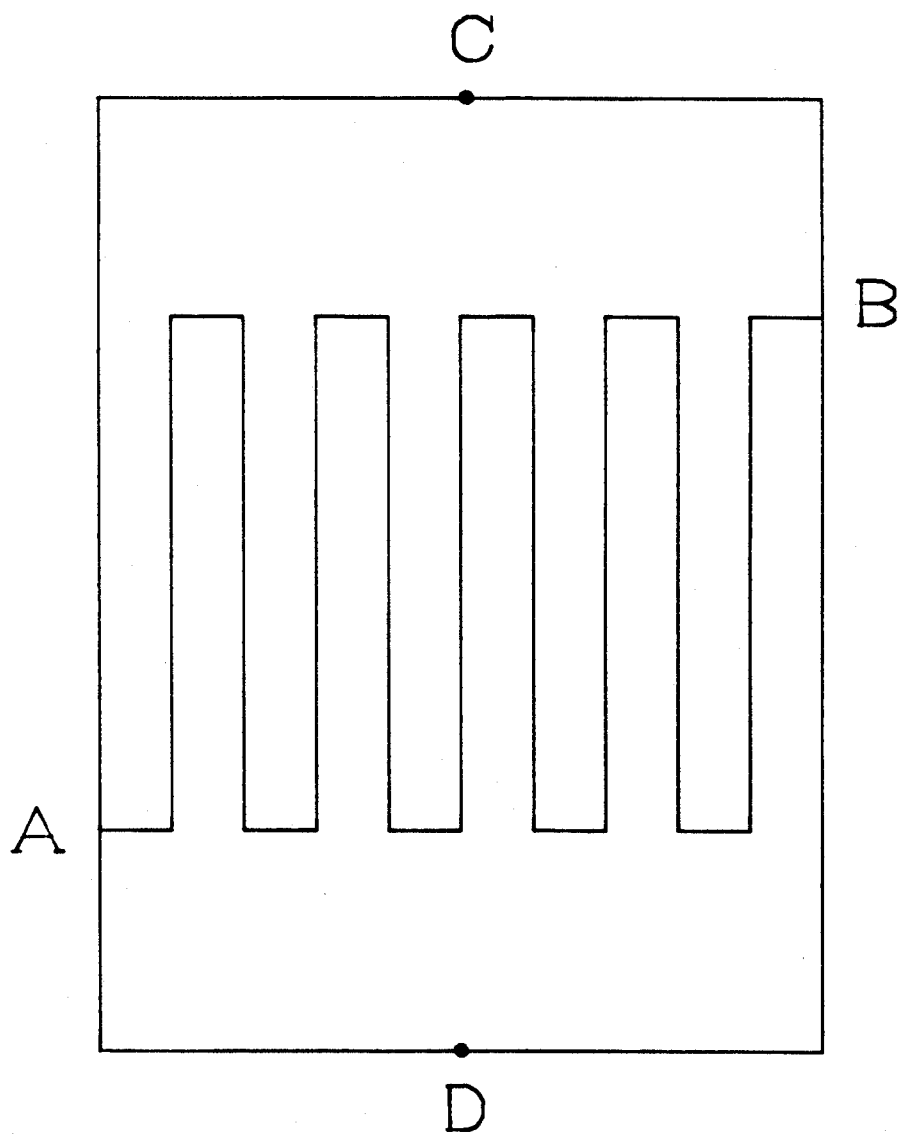
FIG. 2 is an illustrative view of a circuit pattern produced according to an embodiment of the present invention.

On a surface of the resulting superconducting thin film, an oxygen ion beam was moved along a pattern of a wiring line shown in FIG. 2 by actuating the electrostatic lens 8. The condition of the ion source is shown in Table 2.

To determine electric resistance, two pairs of electrodes were connected at points of A,B,C and D on the superconducting thin film (FIG. 2)

The measured values of Tc (the critical temperature) and Tcf (a temperature where resistance become zero completely) on the wiring line A to B and the resistivity between C and D are summarized in Table 2.

TABLE 2

| No. | Material Oxide | Ion source Pressure of $O_2$ (Torr) | RF Power (w) | Acceleration voltage (kV) | Tc (K) | Tcf (K) | Specific Resistance C-D ($\Omega m$) |
| --- | --- | --- | --- | --- | --- | --- | --- |
| 4 | Ba—Y—Cu—O | $1 \times 10^{-3}$ | 50 | 200 | 102 | 89 | $9 \times 10^9$ |
| 5 | Bi—Sr—Ca—Cu—O | $1 \times 10^{-4}$ | 60 | 200 | 105 | 90 | $2 \times 10^{10}$ |
| 6 | Ba—Y—Cu—O | $1 \times 10^{-3}$ | 50 | 200 | 104 | 96 | $1 \times 10^{10}$ |

Table 2 shows that a pattern of a superconducting wiring line having improved superconducting property can be produced by changing locally the crystal structure and the oxygen contents on a surface of non-conductive oxide film.

EXAMPLE 7

A thin film 20 of compound oxide: $YBa_2Cu_3O_x$ was deposited on a plane of (100) of a substrate 10 made of a single crystal of $SrTiO_3$ by the conventional RF sputtering technique.

In this Example, sputtering was carried out in a sputtering gas consisting of argon and oxygen (50:50) with heating the substrate at 200° C. The resulting thin film showed a composition of $YBa_2Cu_3O_{6.9}$ This is an ideal proportion of elements as a superconductor and hence the critical temperature of this film was expected to be 90 K. But, this critical temperature could not be observed actually because the substrate temperature was too low. The resistivity of this film measured at 77K (boiling point of liquidized nitrogen) was 720 $\Omega m$. X-ray diffraction analysis revealed that this film was an amorphous film.

Then, a focused ion beam 30 of argon gas having a beam spot diameter of 0.3 mm was directed onto the film 20 as is shown in FIG. 4 at an accerelation voltage of 7 kV with a beam current intensity of 20 mA/cm² at a scanning speed of 1 mm/sec.

Figure 7:
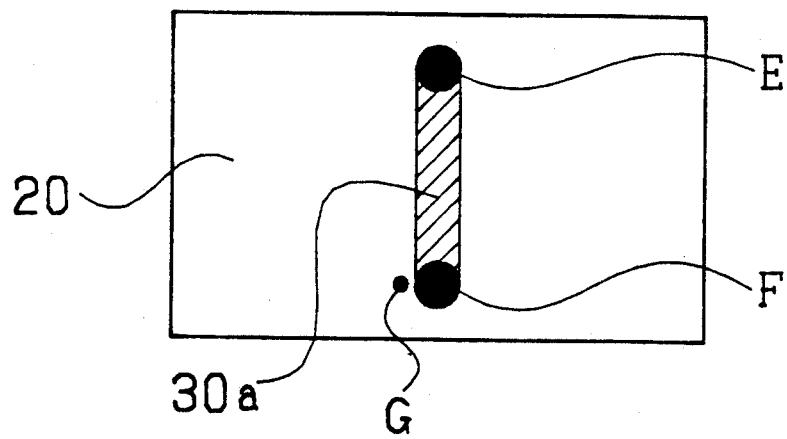

Temperature dependency of resistance of the irradiated film was measured between E and F and between E and G shown in FIG. 7 respectively. The distance between E and F was 10 mm, while the distance between E and G was 0.2 mm. A width of the irradiated area 30a was 0.3 mm. The result showed that the resistance between E and F was zero while the resistance between E and G was 3.8 $M\Omega$ at a temperature of 77K.

It is apparent from the abovementioned fact that only the irradiated area 30a was changed to a superconductor which exhibited superconducting property at a predetermined temperature of 77K, namely a superconducting wiring line having a width of 0.3 mm was produced.

EXAMPLE 8

The same thin film 20 of $YBa_2Cu_3O_x$ as Example 7 was deposited on a plane of (100) of a substrate 10 made of a single crystal of $SrTiO_3$ by the same RF sputtering technique, but in this Example 8 the substrate was heated at 900° C.

When the same sputtering gas (Ar/$O_2$=50/50) as Example 7 was used, the resulting thin film showed the critical temperature (Tc) of 82K.

Then, the sputtering was performed in a different sputtering gas consisting of 90% of argon and 10% of oxygen. The resulting thin film showed a relatively lower critical temperature of 24 K. and a relatively higher resistivity of 540 $\Omega m$ measured at 77 K. (boiling point of liquidized nitrogen). Such a low critical temperature might be resulted from insufficient oxygen contents.

Then, a focused ion beam 30 of argon gas having a beam spot diameter of 0.3 mm was directed onto the film 20 as is shown in FIG. 4 at an acceleration voltage of 5 kV with a beam current intensity of 30 mA/cm² at a acanning speed of 1 mm/sec.

Temperature dependency of resistance of the irradiated film was measured between E and F and between E and G shown in FIG. 7 respectively. The distance between E and F was 10 mm, while the distance between E and G was 0.2 mm. A width of the irradiated area 30a was 0.3 mm. The result showed that the resistance between E and F was zero while the resistance between E and G was 5.9 $M\Omega$ at a temperature of 77 K.

It is apparent from the abovementioned fact that the irradiated area 30a only was changed to a superconductor possessing a superconducting property at a predetermined temperature of 77 K., namely a superconducting wiring line having a width of 0.3 mm was produced.

EXAMPLE 9

The same thin film 20 of $YBa_2Cu_3O_x$ as Example 8 was deposited on a plane of (100) of a substrate 10 made of a single crystal of $SrTiO_3$ by the same RF sputtering technique, but in this Example 9 the substrate was heated at 200° C. Since no sharp peak was observed by the X-ray diffraction analysis, it concluded that this film has not proper crystal structure. Still more, the resulting thin film showed a very lower critical temperature of 4.2 K. and a relatively higher resistivity of 920 $\Omega m$ measured at 77 K. (boiling point of liquidized nitrogen).

Then, a focused ion beam 30 of oxygen gas having a beam spot diameter of 0.3 mm was directed onto the film 20 which was heated at 700° C. in the same manner as Example 9.

Temperature dependency of resistance of the irradiated film was measured by the same method as Example 9. The result showed that the resistance between E and F was zero while the resistance between E and G was 9.8 $M\Omega$ at a temperature of 77 K.

It is apparent from the abovementioned fact that the irradiated area 30a only was changed to a superconductor.

EXAMPLE 10

A thin film which was prepared by the same condition as Example 9 is heated at 700° C. for 1 hour and then cooled rapidly.

Then, the same irradiation of oxygen ion beam as Example 9 was performed.

Temperature dependency of resistance of the irradiated film was measured by the same method as Example 9. The result showed that the resistance between E and F was zero while the resistance between E and G was 8.2 $M\Omega$ at a temperature of 77 K.

It is apparent from the abovementioned fact that the irradiated area 30a only was changed to a superconductor.

What is claimed are:

1. A method for producing a superconducting circuit pattern on a substrate, comprising the steps of:

depositing a thin film layer of a compound oxide which does not initially exhibit satisfactory superconducting properties at 77° K. but can be changed to a superconducting compound oxide after an oxygen ion beam is irradiated on the compound oxide, and then directing a focused oxygen ion beam onto desired areas in a form of a circuit pattern on said thin film layer whereby a portion of said compound oxide corresponding to the areas irradiated by the oxygen ion beam is converted to said superconducting compound oxide which is superconducting at 77° K., thereby producing a superconducting circuit pattern on said substrate and wherein said compound oxide in areas of said thin film not irradiated by the oxygen ion beam is not converted to said superconducting compound oxide.

2. The method set forth in claim 1 wherein said thin film layer of compound oxide is prepared by physical vapour deposition technique.

3. A method set forth in claim 1, characterized in that said ion beam is emitted from an ion source selected from a group consisting of a radio-frequency ion source, a microwave ion source and a PIG type ion source.

4. A process set forth in claim 1, characterized in that said compound oxide is further heat-treated before, during and/or after the irradiation of ion beam.

5. The method set forth in claim 1 wherein said superconducting compound oxide after said oxygen ion beam irradiation is represented by the formula:

$$Ln_1Ba_2Cu_3O_x$$

in which "Ln" is an element selected from the group consisting of Y, Ho, Lu, Sm, Nd, Gd, Eu, Er, Dy, Tm, Yb and La, and "x" is a number satisfying a range of $0<x<1$.

6. A method for producing a superconducting circuit pattern comprising the steps of:

depositing onto a substrate a thin film layer of compound oxide which does not initially exhibit satisfactory superconducting properties at 77° K., but which can be changed to a superconducting compound oxide which is superconducting at 77° K., by oxygen ion beam irradiation; and directing a focused oxygen ion beam onto predetermined desired areas in a form of a circuit pattern on said thin film layer;

whereby said predetermined desired areas irradiated by said ion beam and forming said circuit pattern are converted to said superconducting compound oxide.

* * * * *